(12) United States Patent  
Sir et al.

(10) Patent No.: US 7,217,651 B2  
(45) Date of Patent: May 15, 2007

(54) INTERCONNECTS WITH INTERLOCKS (75) Inventors: Jiun Hann Sir, Penang (MY); Eng Huat Goh, Penang (MY)

(73) Assignee: Intel Corporation, Santa Clara, CA (US)

( * ) Notice: Subject to any disclaimer, the term of this patent is extended or adjusted under 35 U.S.C. 154(b) by 257 days.

(21) Appl. No.: 10/902,446

(22) Filed: Jul. 28, 2004

(65) Prior Publication Data  
US 2006/0022341 A1 Feb. 2, 2006

(51) Int. Cl.  
*H01L 21/4763* (2006.01)

(52) U.S. Cl. .................. 438/622; 438/678

(58) Field of Classification Search .......... 438/618, 438/622, 638, 678  
See application file for complete search history.

(56) References Cited

U.S. PATENT DOCUMENTS 5,874,358 A * 2/1999 Myers et al. ........... 438/640  
6,492,262 B2 * 12/2002 Uzoh .................... 438/637  
6,642,081 B1 * 11/2003 Patti .................... 438/109  
6,946,737 B2 * 9/2005 Sir et al. ............... 257/773

* cited by examiner

*Primary Examiner*—Tuan H. Nguyen  
(74) *Attorney, Agent, or Firm*—Blakely, Sokoloff, Taylor & Zafman LLP (57) ABSTRACT

Embodiments include interconnect of electrically conductive material with a contact surface, and a dielectric layer overlying the contact surface with a trench and via in the dielectric layer, the via extending to the contact surface. An interlock material is in the via with an interlock opening extending through the interlock material and into the interconnect. A layer of electroless material is on the base of the trench and the surfaces of the via, interlock material, and interlock opening. An subsequent interconnect is formed on the electroless material, in the trench, via, and interlock openings. The structure can be repeated to form a stack or column of interconnects that resist delamination.

18 Claims, 5 Drawing Sheets

INTERCONNECTS WITH INTERLOCKS

BACKGROUND

1. Field

Robust stacked via in substrate and printed circuit board ("PCB") with interlocked structure within, more particularly the use and manufacturing of a stack via interconnect that prevents delamination.

2. Background

As the size of semiconductor devices decreases, the density of the circuit elements on the semiconductor device increases, and the interconnect density within the substrate and printed circuit board ("PCB") increases. In order to achieve high density interconnect in the limited space, vias at different layer may be stacked together in a column structure. In substrate and PCB, multiple interconnect layers may be fabricated so that the conductive interconnect layers are separated by dielectric layers. A stacked via in a semiconductor substrate or PCB can provide an electrical connection between conductors on different layers of the substrate or PCB. During manufacturing, packaging, attachment, rework and use condition, the stack via interconnect may experience thermal variation and vertical tensile strain due to the mismatch of coefficient of thermal expansion ("CTE") between stack via interconnect, dielectric and conductor. Therefore, it is desirable to manufacture a stack via that can avoid being damage or delaminating within the column structure which if broken could lead to electrical failure.

BRIEF DESCRIPTION OF THE DRAWINGS

Various features, aspects, and advantages will become more thoroughly apparent from the following detailed description, appended claims, and accompanying drawings in which:

DETAILED DESCRIPTION

Integrated circuits typically use a substrate, circuit device, printed circuit board (PCB), or "package" (e.g., such as a device for electrically connecting an electronic device to a PCB) having conductive interconnections or traces to connect multiple electronic devices, integrated circuits (IC), and/or silicon "chips" (e.g., such as a diced piece of a silicon wafer having electronic devices thereon), such as to send and/or receive signals external therebetween. Currently, popular types of interconnections or traces include aluminum alloy interconnections (lines) and copper interconnections (lines) coupled to individual devices, including other interconnections (lines) by interconnections, for example, through vias. A typical method of forming an interconnection or trace, particularly a copper interconnection or trace, involves forming a via in a dielectric material layer to an underlying interconnection or trace, and then forming an interconnect or trace on the dielectric layer or commonly in a trench in the dielectric layer.

Figure 1:
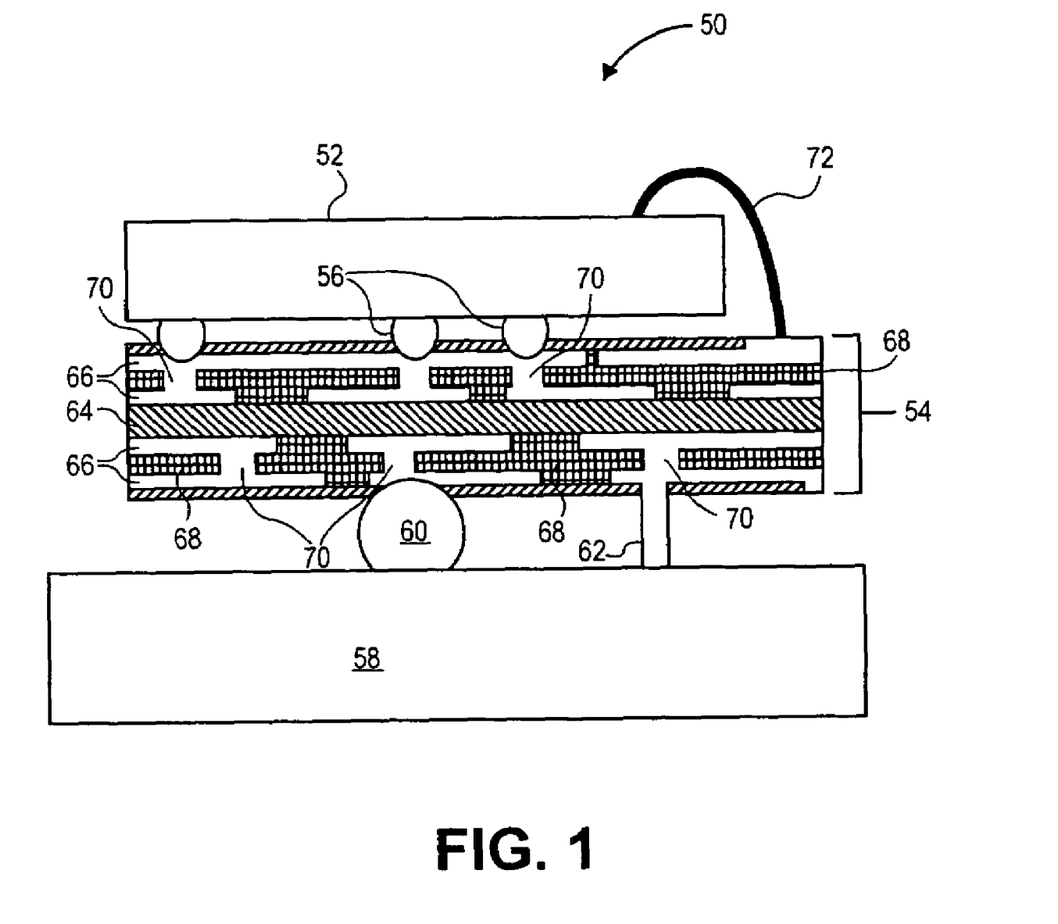
FIG. 1 is side cross section view of an integrated circuit assembly in which an embodiment of the present invention may be used.

FIG. 1 is a side cross section view of an integrated circuit assembly 50 in which an embodiment of the present invention may be used. A silicone die 52 may be connected to a substrate 54 by solder ball 56 or wire bonding 72. The substrate 54 may be connected to a printed circuit board 58 by connector such as solder ball 60 or pin 62. The substrate 54 may have a core 64, conductive layer 66, and dielectric material 68 separating the conductive layer 66. In the illustrated example, the substrate 54 has a core 64 and multilayer conductive layer 66 on both the top and bottom of core 64. The conductive layers 66 may comprise of copper. The multilayer dielectric insulates the conductive layer 66 from each other. Stack vias 70 provide electrical connections between different conductive layer 66 that are separated by dielectric material 68.

Figure 2:
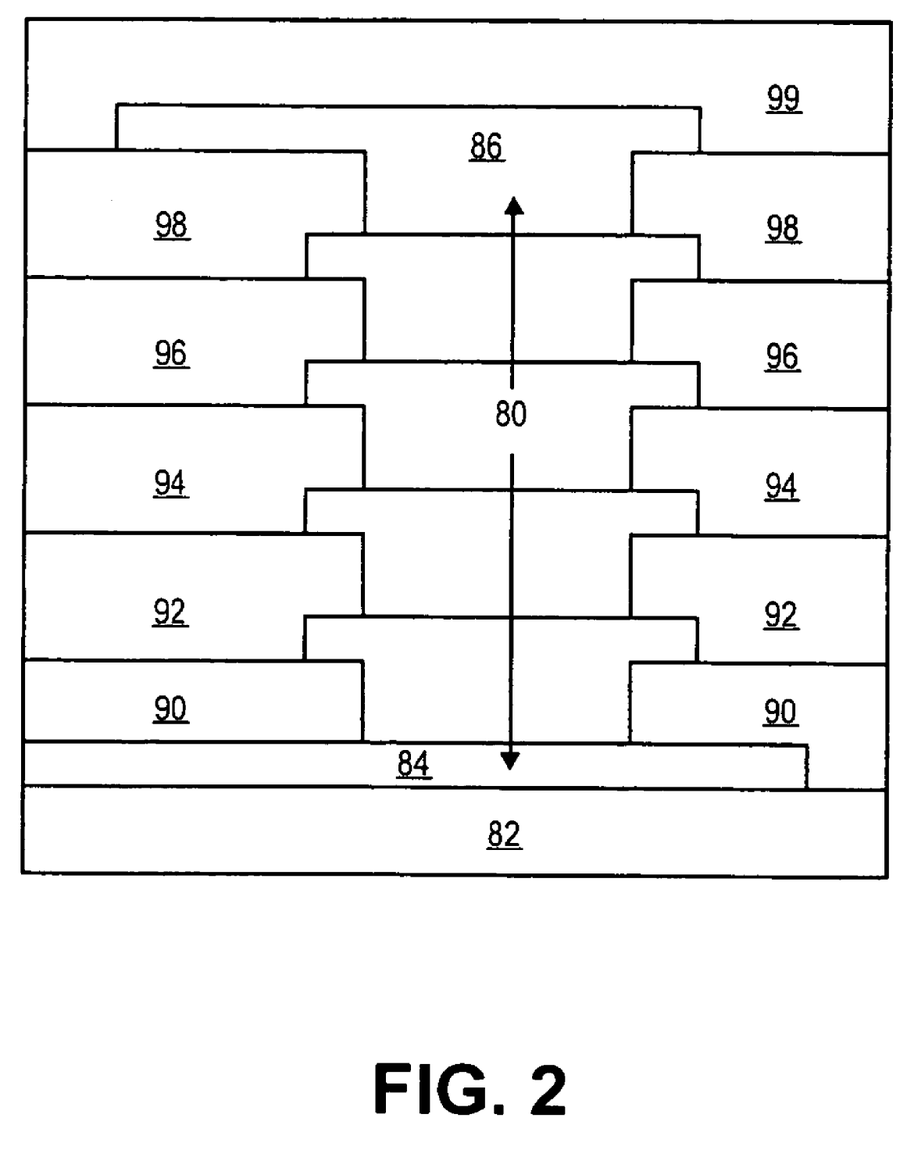
FIG. 2 is the side cross section view providing more details of an embodiment of a stack via.

FIG. 2 is a side cross section view to provide more detail of an embodiment of stack via 80, such as might be used as one of the vias 70 in the integrated circuit assembly 50 of FIG. 1. There may be a first dielectric layer 82. In various embodiments, this first dielectric layer 82 may comprise a resin composite material, such as glass fiber in a hydrocarbon/ceramic matrix, glass fiber in a thermoset polyester matrix, a resin material, such as epoxy, an epoxy-acrylate mixed resin, or other materials. In an embodiment, the first dielectric layer 82 is approximately 30 millimeters (mm) thick, although it may have other thickness in other embodiments.

Over at least part of the first dielectric layer 82 may be a bottom conductor. Bottom conductor 84 may be copper in some embodiments, and may also other conductive materials such as aluminum or nickel in other embodiments. Bottom conductor 84 may be a conductive trace, a conductive plane or another conductor. In an embodiment, the bottom conductor 84 may have a thickness in range of 15 micrometers (μm) to about 25 micrometers, although it may have a different thickness in other embodiments.

Above the bottom conductor is a multilayer of dielectric layers 90, 92, 94, 96, 98, and solder resist 99. Dielectric layers 90, 92, 94, 96, and 98 may comprise of a resin composite material such as silica filler reinforce epoxy resin or mixed resin or other materials. In an embodiment, the second dielectric layers 92, 94, 96, and 98 may be approximately 30 micrometer thick, although they may have other thickness in other embodiments. The dielectric layers 90, 92, 94, 96, and 98 may separate bottom conductor 84 from top conductor 86.

Top conductor 86 may be copper in some embodiment and may also be other conductive materials such as aluminum or nickel in other embodiments. Top conductor 86 may be a conductive trace, a conductive plane or another conductor. In an embodiment, the top conductor may have a thickness in a range from about 15 micrometers to about 25 micrometers, although it may have a different thickness in other embodiments. The stack via 80 may extend from the top conductor 86, through the multilayer dielectric 90, 92, 94, 96, and 98 to bottom conductor 84 forming a column structure. In an embodiment, the column structure of stack via 80 may be built using a copper interlock structure having an interlock opening in stack via 80 to reduce electrolytic/electroless copper interface susceptibility to delamination experienced in conventional stacked via.

Figure 3:
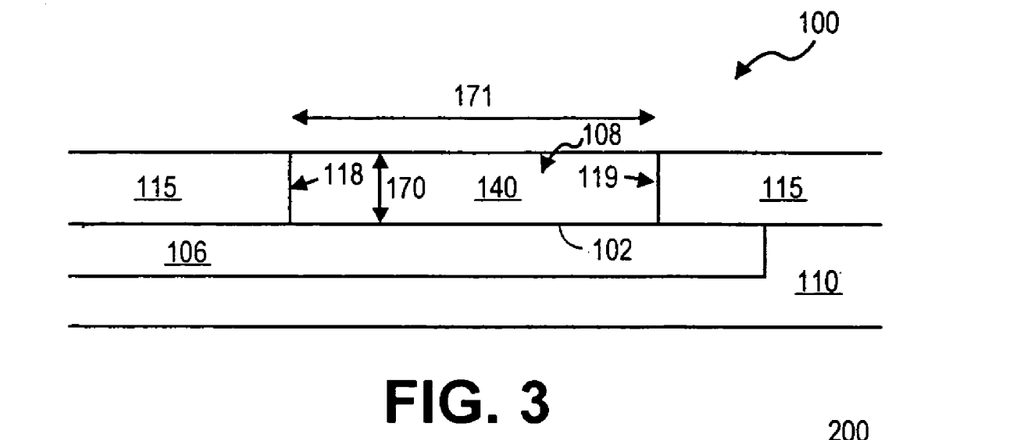
FIG. 3 is a schematic cross-section view of a circuit structure having an interlock material.

FIG. 3 is a schematic cross-section view of a circuit structure having an interlock material. For example, FIG. 3 shows structure 100 having circuit device 106 formed on dielectric material 110. FIG. 3 also shows photoresist material 115 formed on, over, or overlying dielectric material 110 and/or circuit device 106.

Structure 100 may be part of a typical substrate (e.g., such as substrate 50 or PCB 58 as shown in FIG. 1), electronics "board" (e.g., such as a planar board for mounting electrical components or modules), computer board, "motherboard", circuit device, package, integrated circuit structure package, or semiconductor electronic device package to be electrically connected to a processor, microprocessor, digital signal processor, transistor, memory, central processing unit (CPU), silicon chip, or other electronic component. A typical board, electronic device, or package to connect to a microprocessor chip may have, for example, eight or twelve interconnection layers or levels separated from one another by dielectric material.

Specifically, for instance, structure 100 may include one or more electronic devices or transistors, thereon, as well as one or more levels of interconnection to those electronic devices. Thus, structure 100 may be a substrate having a thickness between 30 micrometers (μm) and 800 μm in thickness. Although the thickness may different for different designs.

FIG. 3 shows dielectric material 110 such as a dielectric or core material of a substrate, board or PCB. Dielectric material 110 may be formed, for example, by lamination (film type), coating (liquid type) or pre-form type. Moreover, dielectric material 110 may be or include one or more of an composite materials, a hydrocarbon/ceramic filler/woven glass fiber, a thermoset polyester/woven glass fiber, a polyphenylene oxide (PPO)+special resin/woven glass fiber, a bismaleimide triazine (BT)/epoxy resin/expand PolyTetraFlouroEthylene (PTFE), an epoxy resin/filler/expand PTFE.

FIG. 3 shows circuit 106 having contact surface 102 in dielectric 130 or an opening therein. Circuit 106 may be part of, may be an interconnection line or trace or plane, or may be part of an electronic device as described above with respect to structure 100. For example, vias may be formed in dielectric material 230 between circuit 106 and contacts on the other side of dielectric material 110 (e.g., such as contacts below or under circuit 106).

Circuit 106 may be an electrically conductive interconnection line or trace or plane formed in, on, overlying, or over dielectric 110. It is to be appreciated that circuit 106 may be formed by electroless plating an electrically conductive material followed by electrolytic plating an electrically conductive material, such as an interconnect or trace material, to form an electronic interconnect or trace structure on or in dielectric 110. Moreover, in accordance with embodiments, circuit 106 may be formed of various materials including one or more of a metal, a copper, a copper alloy, an aluminum, a nickel, a gold, a silver, a platinum or a palladium material. It is also contemplated that the material of circuit 106 may be doped (e.g., such as with catalytic metals), annealed, or radiated with some form of energy to form an alloy.

As noted, FIG. 3 shows photoresist material 115 formed on, over, or overlying dielectric material 110 and/or circuit device 106. Photoresist material 115 may have a top surface oriented parallel to a top surface of dielectric material 110 and/or circuit device 106. When initially formed, photoresist material 115 may be formed on or cover contact surface 102. For example, to form photoresist material 115, a photoresist layer such as a dry film photoresist material, may be lamninated, disposed, or formed over the surface of dielectric material 110 and may be formed over contact surface 102, such as by a process known in the art. It is contemplated that the photoresist layer (e.g., such as photoresist material 115 as shown in FIG. 3) may have thickness 170 of between 15 μm and 20 μm, such as by having a thickness of 15 μm, 16 μm, 17 μm, 18 μm, 19 μm or 20 μm.

According to embodiments, via opening 108 may be formed in a photoresist layer (e.g., such as photoresist material 115). For example, via opening 108 may be formed by etching or patterning a photoresist layer (e.g., such as photoresist material 115), or by other processes as known in the art.

In particular, a portion of the photoresist layer (e.g., such as photoresist material 115 as shown in FIG. 3) may be exposed to light (e.g., such as ultraviolet or other appropriate light to expose the photoresist material for development) including a portion of the photoresist layer beyond or extending beyond a perimeter area or a zone of via opening 108 (e.g., such as shown by photoresist material 115 of FIG. 3). Next, portions of the photoresist material may be developed, etched, and/or removed excluding the portions of the photoresist material exposed to the light. For instance, a portion of photoresist material corresponding to via opening 108 of FIG. 3 may be removed to form via opening 108 defining or forming via sidewalls 118 and 119 (e.g., such as sidewalls of photoresist material 115) extending from a top surface of via opening 108 to contact surface 102.

Specifically, via opening 108 may be formed by patterning or protecting a surface area of photoresist material corresponding to via opening 108 from UV light with a glass mask having a design formed on the glass mask, placed between a UV light and the dry film. Subsequently, the dry film area exposed to the light undergoes an x-linking, and thus remains in tack on dielectric material 110 and circuit device 106 during a subsequent developing process of the dry film. Thus, after development, the dry film area protected by the glass mask from the UV light is removed to form via opening 108.

According to embodiments, via opening 108 may have a depth corresponding to thickness 170, as described above for interlock material 140. Similarly, via opening 108 may have a width 171 (e.g., such as a width, width and length, or a diameter of via opening 108) between 50 μm and 100 μm, such as by having interlock width 171 of 50 μm, 60 μm, 70 μm, 80 μm, or 90 μm.

FIG. 3 also shows interlock material 140 in via opening 108 in photoresist material 115. Interlock material 140 may be formed on via sidewalls 118 and 119 extend from a top surface of via opening 108 to contact surface 102. Thus, interlock material 140 may fill via opening 108. Further, interlock material 140 and/or via opening 108 may define various surface area shapes with respect to in photoresist material 115. For example, interlock material 140 and/or via opening 108 may be circular, oval, square, rectangular, triangular, hexagonal, or another appropriate shape for providing a sufficient electrical conductive contact between a device or material on or connected to interlock surface 202 and a device or material on or connected to contact surface 102, for operation of circuit device 106 or structure 100 as described herein. Notably, interlock material 140 and/or via opening 108 may have one or more via sidewalls (e.g., such as by sharing one sidewall where defining a circle on the surface of photoresist material 115 or sharing four via sidewalls defining a square).

Interlock material 140 may be an electrically conductive material formed in via opening 108 and on, overlying, or over contact surface 102 to form and electrically conductive path between a devices or materials on or connected to interlock surface 202 and contact surface 102. In some cases, interlock material 140 may be formed by electrolytic plating an electrically conductive material, such as an interconnect or trace material to form an electronic interconnect or conductive structure between a device or material on or connected to interlock surface 202 and a device or material on or connected to contact surface 102. Moreover, in accordance with embodiments, interlock material 140 may be formed of various materials including one or more of a metal, a copper, a copper alloy, a tin, an indium, a cadmium, a zinc, an aluminum, a nickel, a gold, a silver, a platinum, a bismuth, a ruthenium, a rhodium, a rhenium, a cobalt, and/or a palladium material.

Specifically, interlock material 140, such as copper, may be introduced by electroplating or physical deposition in a sufficient amount to fill via opening 108. Copper has become a popular choice of interconnection material for various reasons, including its low resistivity compared with the resistivity of aluminum or aluminum alloys. It is also contemplated that the material of interlock material 140 may be doped (e.g., such as with catalytic metals), annealed, implanted, etched, radiated (e.g., such as radiated with some form of energy to form an alloy), or otherwise treated appropriately during fabrication of a PCB or an electronic device (e.g., such as devices described above with respect to circuit device 106 and/or structure 100).

Thus, interlock material 140 may be formed on, formed over, connected to, form a metal to metal adhesion with, and/or be electrically connected to an area, a portion, and/or a contact area of contact surface 102 of circuit device 106. Furthermore, according to embodiments, interlock material 140 and circuit device 106 may have the same, a similar, equal, or relatively close (e.g., such as by being within 2%, 3%, 5%, or 10%) grain structures, mechanical properties (e.g., such as physical material properties) and/or thermal properties (e.g., such as thermal resistance and expansion and retraction coefficients).

More particularly, circuit device 106 and interlock material 140 may be formed, such as be being deposited, with a similar or same electrolytic deposition process so that they form a continuous electrolytic material stack, and thus has a similar grain structure, mechanical properties, and thermal properties. For instance, circuit device 106 and interlock material 140 may be deposited using the same electrolytic metal, copper, aluminum, and/or nickel deposition process to have a similar or same grain structure, mechanical properties, and thermal properties as described above. Hence, the interface, electrical connection, attachment, bonding, and/or attachment between circuit device 106 and interlock material 140 resist separation or delamination during tensile strain, such as in the vertical direction, and/or changes in temperature, such as during thermal treatment, annealing, or temperatures experienced during the lifetime of the structure in which they are included. In particular, the electrical connection, attachment, or coupling between circuit device 106 and interlock material 140 may be formed to resist separation or delamination during assembly processes, heat treatments, temperature cycle stress, vertical tensile stress, and high Z-axis thermal expansion in surrounding dielectric.

In one instance, circuit device 106 and interlock material 140 are formed by electrolytic plating including the deposition of copper using an external source of electric current. Here, an anode, made from copper, serves as a source of copper ions, where the anode is under a different potential voltage than a cathode (e.g., such as an electroless copper formed over the surfaces that interlock material 140 is shown formed on or over in FIG. 3, during a pre-treatment process, as known in the art). Thus, copper on or as part of the anode dissolves from the anode into copper ions and migrates to the cathode, and becomes deposited on the electroless material (e.g., such as a copper pre-treated surface) to form a productive copper layer (e.g., such as to form interlock material 140 as shown in FIG. 4).

In some cases, an electroplating process for forming circuit device 106 and/or interlock material 140 may involve introducing a substrate or board into an aqueous solution containing metal ions, such as copper sulfate-based solution, and reducing the ions (reducing the oxidation number) to a metallic state by applying current between the substrate or board and an anode of an electroplating cell in the presence of the solution. Thus, such an electrolytic plating may be used to form a sufficient amount of interlock material 140 onto circuit device 106 and conductive polymer 250 to fill, for example, via opening 108 and to form an electrically conductive interconnection to contact surface 102, such as by substantially coating via sidewalls 118 and 119, and/or contact surface 102.

According to embodiments, interlock material 140 may have thickness 170 between 15 μm and 20 μm, such as by having a thickness of 15 μm, 16 μm, 17 μm, 18 μm, 19 μm or 20 μm. Similarly, interlock material 140 may have a width 171 (e.g., such as a width, width and length, or a diameter of via opening 108) between 30 μm and 100 μm, such as by having interlock width 171 of 40 μm, 50 μm, 52 μm, 54 μm, 56 μm, 58 μm, 59 μm, 60 μm, 61 μm, 62 μm, 64 μm, 66 μm, 68 μm, 70 μm, 80 μm, or 90 μm.

Figure 4:
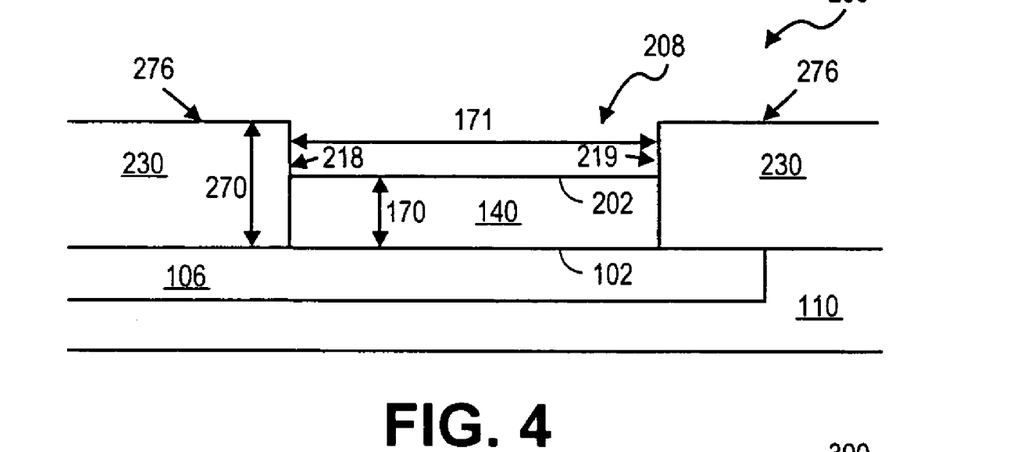
FIG. 4 shows the structure of FIG. 3 after forming a layer of dielectric having a via opening over the circuit structure.

FIG. 4 shows the structure of FIG. 3 after forming a layer of dielectric having a via opening over the circuit structure. More particularly, FIG. 4 shows structure 100 of FIG. 3 after photoresist material 115 has been removed and replaced with dielectric material 230. For instance, portions or all remaining photoresist material 115 as shown in FIG. 3 may be stripped, developed, and/or removed from above, on, over, or overlying the surface of circuit device 106 and dielectric material 110. It is contemplated that such stripping or removing may include processes described above with respect to removing or patterning a portion of a photoresist layer (e.g., such as dry film stripping remaining photoresist material 115) to form via opening 108, as described above with respect to FIG. 3.

In addition, according to embodiments, after portions or all remaining photoresist material 115 have been removed from on, over, overlying, or being disposed above the surface of circuit device 106 and dielectric material 110, those surfaces may be etched. Specifically, the surface of dielectric material 110 may be etched, such as by "quick etching" with an etch process that includes an $H_2SO_4$ concentrate and/or an $H_2O_2$ concentrate, or another process to remove unwanted electroless material (e.g., such as to remove an unwanted electroless layer from the surface of dielectric material 110).

FIG. 4 also shows dielectric material 230 on, overlying, or over dielectric material 110 and/or circuit device 106. Dielectric material 230 may be formed such as by laminating, pressing, hot pressing, heating, baking, pre-curing, and curing. Also, dielectric material 230 may include any or a combination of anjinomoto build up film (ABF), ABF-SH, ABF-GX, interpenetrate network (IPN), an epoxy, a resin, an epoxy resin, a epoxy/phenol novolac resin, a epoxy-acrylate photosensitive, and a thermoset cycloolefin/epoxy resin. It is also contemplated that dielectric material 230 may be a material such as is described above with respect to dielectric material 110. Dielectric material 230 may have top surface 276 oriented parallel to a top surface of dielectric material 110 and/or circuit device 106 (e.g., such as parallel to contact surface 102). When initially formed, dielectric material 230 may be formed on or cover interlock material 140.

For example, FIG. 4 shows via opening 208 having via sidewalls 218 and 219 extending from top surface 276 to interlock surface 202. Via opening 208 may be an opening defining various surface area shapes with respect to dielectric material 230. For example, via opening 208 may be circular, oval, square, rectangular, triangular, hexagonal, or another appropriate shape for providing a sufficient opening for electrically conductive material to be formed on interlock surface 202. Notably, via opening 208 may have one or more via sidewalls (e.g., such as by having one sidewall where via opening 208 defines a circle in top surface 276, or having four via sidewalls where via opening 208 defines a square in top surface 276). Also, via opening 208 may have a shape, physical dimension, length, width, and/or depth as described above for via opening 108.

According to embodiments, dielectric material 230 may have depth 270 between 30 μm and 50 μm, such as by having a depth of 31 μm, 32 μm, 34 μm, 36 μm, 38 μm, or 40 μm. Also, via opening 208 may have a depth or distance from top surface 276 to interlock surface 202 (e.g., such as depth 270 minus thickness 170) between 15 μm and 30 μm, such as by having a depth of 16 μm, 17 μm, 18 μm, 19 μm, 20 μm, 21 μm, 22 μm, 23 μm, 24 μm, 25 μm, 26 μm, 27 μm, 28 μm, or 29 μm. Similarly, via opening 208 may have width 171 as described above.

Thus, it is considered that via opening 208 may expose all or a portion of interlock surface 202, and may expose a perimeter of the surface of dielectric material 230. Specifically, via opening 208 may expose a sufficient surface area of interlock surface 202 to form an electrically conductive connection between a conductive material formed in via opening 208 and interlock surface 202. According to embodiments, via opening 208 may be formed by removing a portion of dielectric material 230 to form an opening. For example, a portion of dielectric material 230 may be removed by evaporating or drilling the portion with a carbon dioxide ($CO_2$) laser or an ultraviolet (UV) light laser, or by etching.

Figure 5:
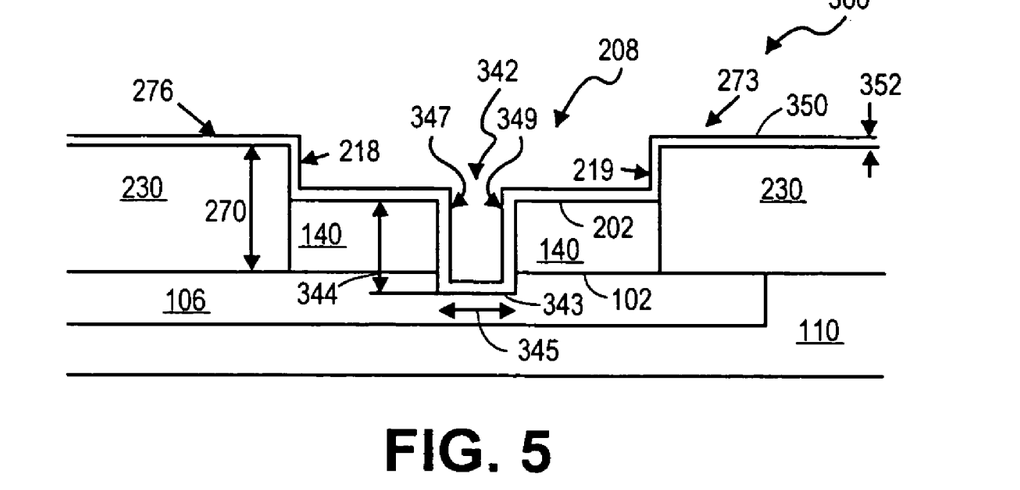
FIG. 5 shows the structure of FIG. 4 after forming an interlock opening in the interlock material and after forming a layer of electroless material on the dielectric, in the via opening and in the interlock opening.

FIG. 5 shows the structure of FIG. 4 after forming an interlock opening in the interlock material and after forming a layer of electroless material on the dielectric, in the via opening and in the interlock opening. FIG. 5 shows interlock opening 342 formed in interlock surface 202 of interlock material 140, defining interlock sidewalls 347 and 349, and to interlock base 343. For example, interlock opening 342 may be formed by removing a portion of interlock material 140 to form an opening. More particularly, a portion of interlock material 140 may be removed by evaporating or drilling the portion with an ultraviolet (UV) light laser, or by etching.

According to embodiments, interlock depth 344 may be between 20 μm and 30 μm, such as by having a thickness or depth of 23 μm, 25 μm, or 29 μm. Similarly, interlock width 345 (e.g., such as a width, width and length, or a diameter of interlock opening 342 and/or interlock base 343) may be between 30 μm and 50 μm, such as by having interlock width 345 of 35 μm, 40 μm, or 45 μm.

FIG. 5 also shows electroless material 350 formed on or over surfaces of dielectric material 230, via opening 208, and interlock opening 342. Specifically, FIG. 5 shows electroless material 350 formed on, layered on (e.g., such as by being conformally formed on), or coating top surface 276, in via opening 208, on via sidewalls 218 and 219, to interlock surface 202, in interlock opening 342, on interlock sidewalls 347 and 349, and to interlock base 343.

According to embodiments, electroless material 350 may be formed by an electroless plating process to form an electroless material layer of an electrically conductive material. Such a process may include the deposition of a conductive material (e.g., such as copper) on a catalytic surface (e.g., such as palladium) from solution without an external source of current. This process may be a process or preliminary process in preparing dielectric materials or articles and conductive materials (e.g., such as metal) for electroplating. After cleaning and etching, the dielectric and conductive material surfaces can be immersed in solutions that react to precipitate a catalytic metal in situ (e.g., such as palladium).

In some cases, a process for forming electroless material 350 may involve introducing a substrate or board (e.g., such as a PCB including dielectric and conductive materials) in an acidic stannous chloride solution (e.g., such as a solution including tin). Then, the substrate or board may be introduced into a solution of palladium chloride; to cause palladium to be reduced to its catalytic metallic state by the tin.

Another appropriate way of producing a catalytic surface is to immerse the dielectric and conductive materials in a colloidal solution of palladium followed by immersion in an accelerator solution. The dielectric and conductive materials thus treated can then plated with a conductive material (e.g., such as a metal, like copper) by the electroless method in replenisher solution that contains complexes (e.g., such as complexes of a metal, like copper) and formaldehyde, which forms a conductive material (e.g., such as a metal, like copper) surface which then can be plated with thicker layer of a conductive material (e.g., such as a metal, like copper) by an electroplating method.

Appropriate conductive materials for electroless material 350 include one or more of a metal, a copper, a copper alloy, a tin, an indium, a cadmium, a zinc, an aluminum, a nickel, a gold, a silver, a platinum, a bismuth, a ruthenium, a rhodium, a rhenium, a cobalt, and/or a palladium material. Thus, electroless material 350 may be formed on, overlying, or over interlock surface 202 to form and electrically conductive path, conduit, interconnect or structure between devices or materials on or connected to interlock surface 202 and devices or materials on or connected to the surface of electroless material 350.

It is also considered that electroless material 350 may provide enhanced adhesion between devices or materials on or connected to surfaces of electroless material 350 as well as to structures formed on surfaces of electroless material 350. In addition, electroless material 350 may include or be selected to be a layer of material having a property tending to reduce metal diffusion and/or reduce electron migration between layers formed above and below or around electroless material 350. Furthermore, electroless material 350 may have thickness 352 of between 0.01 μm and 1.0 μm, such as by having a thickness of 0.05 μm, 0.075 μm, 0.1 μm, 0.125 μm, 0.15 μm, or 0.175 μm.

Figure 6:
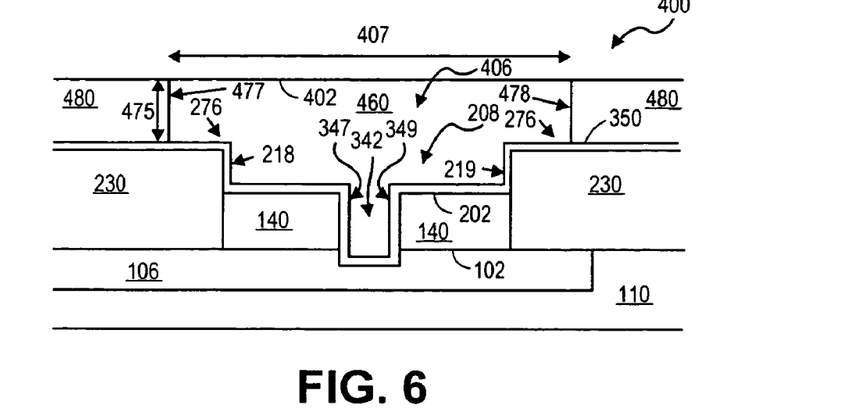
FIG. 6 shows the structure of FIG. 5 after forming an interconnect material on the dielectric, in a trench opening, in the via opening and in the interlock opening.

FIG. 6 shows the structure of FIG. 5 after forming an interconnect material on the dielectric, in a trench opening, in the via opening and in the interlock opening. FIG. 6 shows interconnect material 460 formed on or over surfaces of trench opening 406, via opening 208 and in interlock opening 342. In other words, interconnect material 460 may be in or fill trench opening 406, via opening 208 and in interlock opening 342. According to embodiments, interconnect material 460 may be formed in a trench opening of a photoresist material formed on or over dielectric material 230. For example, FIG. 6 shows photoresist material 480 formed on or over electroless material 350 and defining trench opening 406 having trench sidewalls 477 and 478, and a trench base at top surface 276.

To form photoresist material 480, a photoresist layer such as a dry film photoresist material, may be laminated, disposed, or formed over the surface of dielectric material 230 (e.g., such as by being formed on the surface of electroless material 350 disposed over dielectric material 230) and may be formed over via opening 208, such as by processes known in the art. It is contemplated that the photoresist layer (e.g., such as photoresist material 480 as shown in FIG. 6) may have a thickness of between 15 μm and 20 μm, such as by having a thickness of 16 μm, 17 μm, 18 μm, 19 μm, or 20 μm.

Next, a portion of the photoresist layer (e.g., such as photoresist material 480 as shown in FIG. 6) may be removed as described above with respect to forming via opening 108 in photoresist material 115. For instance, a portion of photoresist material corresponding to trench opening 406 of FIG. 6 may be removed to form trench opening 406 defining trench sidewalls 477 and 478 of photoresist material 480, and a trench base at top surface 276 of dielectric material 230 (e.g., such as at top surface 276 of electroless material 350 disposed over dielectric material 230).

Thus, it is considered that trench opening 406 may expose all or a portion of top surfaces 276 (e.g., such as a perimeter of the surface of electroless material 350 around via opening 208) and may expose via opening 208 and interlock opening 342. Specifically, trench opening 406 may expose a sufficient surface area of via opening 208 to form an electrically conductive connection between a conductive material formed in trench opening 406 and interlock surface 202.

Further, trench opening 406 may define various surface area shapes with respect to in photoresist material 480. For example, trench opening 406 may be circular, oval, square, rectangular, triangular, hexagonal, or another appropriate shape for providing a sufficient electrical conductive contact between a device or material on or connected to a surface of trench opening 406 and a device or material on or connected to contact surface 102, for operation of circuit device 106 or structure 100 as described herein.

Trench opening 406 may have depth 475 of between 15 μm and 20 μm, such as by having a depth of 16 μm, 17 μm, 18 μm, or 19 μm. Additionally, trench opening 406 may form an opening or width, such as width 407, of between 60 μm and 150 μm, such as by having a width of 70 μm, 80 μm, 90 μm, or 100 μm. For example, as shown in FIG. 6, trench opening 406 has an opening size that is larger than the opening size of via opening 108, and is located with respect to via opening 108 to define or form a trench base around, along, and/or on both ends of the perimeter of via opening 208. Specifically, it is considered that electroless material 350 may exist on the trench base (e.g., such as by existing on top surface 276).

It is also contemplated that trench opening 406 may form an opening extending into and out of the cross-section view shown in FIG. 6 for a distance equal to or greater than that described above with respect to width 407. Specifically, it is considered that trench opening 406 may extend a length into and out of the cross-section view shown in FIG. 6 sufficient to provide a trench to more than one via opening to more than one contact of an electronic device, such as via opening 208, such as is known in the art.

According to embodiments, after trench opening 406 is formed, interconnect material 460, such as an electrically conductive material, may be formed on surfaces of trench opening 406, via opening 208, and interlock opening 342. Specifically, interconnect material 460 may be formed on any or all of trench sidewalls 477 and 478, top surface 276, via sidewalls 218 and 219, interlock surface 202, interlock sidewalls 347 and 349, and interlock base 343 (e.g., such as by being attached to, contacting, or being electrically coupled to those sidewalls, surfaces, and base). Moreover, FIG. 6 shows interconnect material 460 formed on electroless material 350, such as by being formed on electroless material 350 with a sufficient thickness to fill trench opening 406, via opening 208, and interlock opening 342.

Interconnect material 460, such an electrically conductive material, may be introduced by electroplating or physical deposition in a sufficient amount to fill trench opening 406 and via opening 208, and to interlock surface 202 (e.g., such as by being formed on or over electroless material 350 which is on or over interlock surface 202) to complete an interconnect structure that includes interlock material 140, electroless material 350, and interconnect material 460. Once introduced, the interconnection structure may be planarized and a dielectric material layer (including an interlayer dielectric material) introduced over the interconnection structure to suitably isolate the structure. Copper has become a popular choice of interconnection material for various reasons, including its low resistivity compared with the resistivity of aluminum or aluminum alloys.

According to embodiments, interconnect material 460 may be formed by an electrolytic plating process to form an electrolytic material layer of an electrically conductive material. Such a process may include the deposition of a conductive material (e.g., such as copper) on a catalytic surface (e.g., such as electroless layer 350). In one instance, interconnect material 460 is formed by electrolytic plating including the deposition of copper using an external source of electric current. Here, an anode, made from copper, serves as a source of copper ions, where the anode is under a different potential voltage than a cathode (e.g., such as an electroless copper formed over the surfaces that interconnect material 460 is shown formed on or over in FIG. 6, described herein). Thus, copper on or as part of the anode dissolves from the anode into copper ions and migrates to the cathode, and becomes deposited on the electroless material (e.g., such as a copper pre-treated surface) to form a productive copper layer (e.g., such as to form interconnect material 460, as shown in FIG. 6).

In some cases, an electroplating process for forming interconnect material 460 may involve introducing a substrate or board into an aqueous solution containing metal ions, such as copper sulfate-based solution, and reducing the ions (reducing the oxidation number) to a metallic state by applying current between the substrate or board and an anode of an electroplating cell in the presence of the solution. Thus, such an electrolytic plating may be used to form a sufficient amount of interconnect material 460 onto electroless material 350 to fill, for example, trench opening 406, via opening 208, and interlock opening 342; and to form an electrically conductive interconnection to interlock surface 202, such as by substantially coating interlock surface 202.

According to embodiments, formation of interconnect material 460 may create a metal to metal adhesion between interconnect material 460 and interlock material 140. This metal to metal adhesion may have a layer of foreign metal in between interconnect material 460 and interlock material 140 with different mechanical and thermal properties than either interconnect material 460 or interlock material 140 (e.g., such as palladium seeding to act as a catalyst, as described above for forming electroless material 350 of FIG. 5). The different mechanical and thermal properties of the layer of foreign metal may weaken the adhesion between interconnect material 460 and interlock material 140 causing the adhesion to be prone to delamination or separation.

Similarly, the metal to metal adhesion may have an electroless/electrolytic material interface in between interconnect material 460 and interlock material 140 with different grain structure than either interconnect material 460 or interlock material 140 due to different method of deposition (e.g., such as the interface between interlock material 140 and electroless material 350, as well as the interface between electroless material 350 and interconnect material 460). The different grain structure leads to different mechanical and thermal properties for electroless material 350 as compared to either interconnect material 460 or interlock material 140, and this in-compatibility may cause the interface between interconnect material 460 and interlock material 140 to be prone to delamination or separation, such as during temperature changes.

Appropriate conductive materials for interconnect material 460 include one or more of a metal, a copper, a copper alloy, a tin, an indium, a cadmium, a zinc, an aluminum, a nickel, a gold, a silver, a platinum, a bismuth, a ruthenium, a rhodium, a rhenium, a cobalt, and/or a palladium material. It is also contemplated that the material of interconnect material 460 may be doped (e.g., such as with catalytic metals), annealed, implanted, etched, radiated (e.g., such as radiated with some form of energy to form an alloy), and/or experience other semiconductor processing settings or treatments known in the art for forming semiconductor devices, circuit structures, transistors, and electronic devices (e.g., such as devices described above with respect to circuit device 106 and/or structure 100).

Further, interconnect material 460 may define various surface area shapes with respect to in photoresist material 480. For example, interconnect material 460 may be circular, oval, square, rectangular, triangular, hexagonal, or another appropriate shape for providing a sufficient electrical conductive contact between a device or material on or connected to a surface of interconnect material 460 and contact surface 102, for operation of circuit device 106 or structure 100 as described herein.

Similarly, interconnect material 460 may be formed on or over and be electrically connected to an area of or a contact area of interlock surface 202 (e.g., such as by being formed on or over electroless material 350 which is on or over interlock surface 202). Thus, it is considered that interconnect material 460 be formed on a sufficient surface area of interlock surface 202 (e.g., such as by being formed on or over electroless material 350 which is on or over interlock surface 202) to form an electrically conductive connection between a conductive material or device formed in interconnect material 460 and interlock surface 202.

Interconnect material 460 may have a thickness corresponding to the description above for depth 475, depth 270, and interlock depth 344; and may have a width corresponding to the description above for width 171, 345, and 407. It is also contemplated that interconnect material 460 may form an opening extending into and out of the cross-section view shown in FIG. 6, such as described above for trench opening 406.

According to embodiments, interlock material 140, thickness 170, width 171, via opening 108, and other factors described herein related to formation and physical dimensions (e.g., shapes with respect to via opening 208 and/or trench opening 406) of interlock material 140, may be selected to increase bonding, attachment, and/or electrical conduction between interlock material 140 and interconnect material 460. For example, the bottom of via opening 108 may experience a high amount of stress vertical tensile stress (e.g., such as due to a high Z-axis thermal expansion in surrounding dielectric materials) as compared to other depths within via openings 108 or 208, or trench opening 406 that are not aligned with a surface of circuit device 106, dielectric material 110, or dielectric material 230.

Thus, these dimensions and factors may be selected so that the use of interlock material 140 (e.g., such as including interlock surface 202 and interlock opening 342) moves the electroless/electronlytic material interface (e.g., such as the interface between interlock material 140 and electroless material 350, as well as the interface between electroless material 350 and interconnect material 460) away from the bottom of via opening 108. Specifically, moving the electroless/electronlytic material interface from the bottom of via opening 108 may increase bonding, attachment, and/or electrical conduction between interlock material 140 and interconnect material 460 (e.g., such as including bonding, attachment, and/or electrical conduction between interlock material 140 and electroless material 350, as well as between electroless material 350 and interconnect material 460).

Furthermore, these dimensions and factors may be selected so that the interlock sidewalls 347 and 349 have surfaces (e.g., such as vertical surfaces with respect to contact surface 102) on which to form interconnect material 460, and interlock opening 342 has a hole or notch shaped locking structure or physical dimension in which to form interconnect material 460, to increase the bonding or attachment forces between interlock material 140 and interconnect material 460 (e.g., such as including electroless material 350). It can also be noted that interlock opening 342 increases the surface size of the electroless/electronlytic material interface and moves part of the electroless/electronlytic material interface away from the bottom of via opening 108 and closer to the axis of via opening 108, thus, further increasing the bonding or attachment forces between interlock material 140 and interconnect material 460.

Hence, the selections above may consider reducing or resisting separation or delamination between circuit device 106, interlock material 140, electroless material 350, and interconnect material 460, such as during and after doping, implantation, etching, radiation, and/or during and after experiencing other semiconductor processing settings or treatments known in the art for forming semiconductor devices, circuit structures, transistors, and electronic devices (e.g., such as devices described above with respect to circuit device 106 and/or structure 100). In particular, the physical and electrical connection or attachment between circuit device 106 and interconnect material 460 may be formed to resist separation or delamination during assembly processes, heat treatments, temperature cycle stress, vertical tensile stress, and high Z-axis thermal expansion in surrounding dielectric materials.

Figure 7:
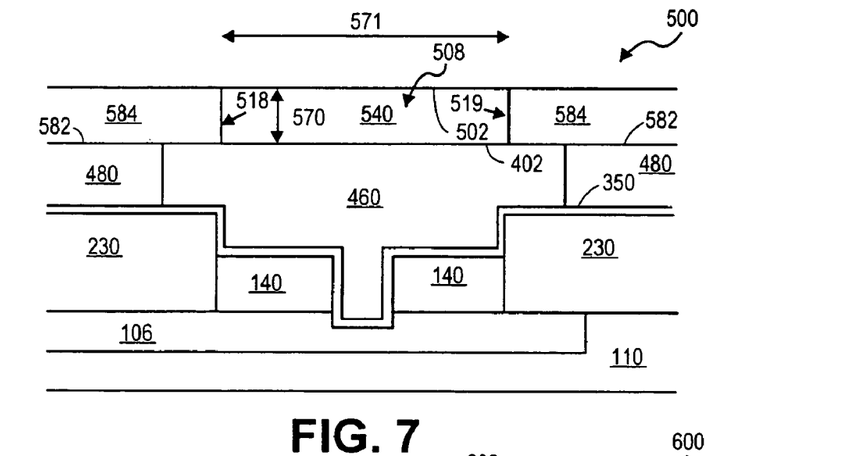
FIG. 7 shows the structure of FIG. 6 after forming an additional interlock material on the interlock material.

FIG. 7 shows the structure of FIG. 6 after forming an additional interlock material on the interlock material. FIG. 7 shows interlock material 540 formed in via opening 508 in photoresist material 584. Photoresist material 584 is formed on or over photoresist surface 582 of photoresist material 480. For example, when initially formed, photoresist material 584 may be formed on or cover interconnect surface 402 and photoresist surface 582 of photoresist material 480. Photoresist material 584 may have a top surface oriented parallel to a top surface of photoresist material 480 and/or circuit device 106.

Photoresist material 584 may include via opening 508 defining or forming via sidewalls 518 and 519 (e.g., such as sidewalls of photoresist material 584) extending from a top surface of via opening 508 to interconnect surface 402. In addition, photoresist material 584 may be formed of a material, by a process, and have physical dimensions such as is described above with respect to photoresist material 115. Specifically, photoresist material 584 may have via opening 508 similar to via opening 108, via sidewalls 518 and 519 similar to via sidewalls 118 and 119, thickness 570 similar to thickness 170, in material, formation process, and physical dimension, as described for in FIG. 3.

FIG. 7 also shows via opening 508 in photoresist material 584, having via sidewalls 518 and 519, and to interconnect material 460. According to embodiments, via opening 508 may be formed as described above, have physical dimensions as described above (e.g., such as by having a size, height, width, depth, and/or diameter as described above) with respect to via opening 108. Specifically, via opening 508 may be similar to via opening 108, defining via sidewalls 518 and 519 similar to via sidewalls 118 and 119, have a depth similar to thickness 570, and have width 571 similar to width 171 in material, process of formation, and physical dimension, as described for in FIG. 3.

Moreover, via opening 508 may be formed to the surface of interconnect material 460, such as is described above with respect to via opening 108 being formed to contact surface 102, so that interconnect material can be deposited in via opening 508 to form an electrical connection with interconnect material 460, similar to that described above with respect to forming an electrical connection between interconnect material 460 and contact surface 102.

FIG. 7 also shows interlock material 540 in via opening 508 in photoresist material 584. Interlock material 540 may be formed on via sidewalls 518 and 519 extend from a top surface of via opening 508 to interconnect surface 402. Thus, interlock material 540 may fill via opening 508.

Interlock material 540 may be formed of a material, by a process, and have physical dimensions such as is described above with respect to interlock material 140, as described in FIG. 3. Specifically, interlock material 540 may be formed of a material similar to interlock material 140, with a process similar to forming interlock material 140 (e.g., such as electrolytic plating of copper), have a shape with respect to surface of photoresist material 584 similar to interlock material 140 with respect to the surface of photoresist material 115, be formed in via opening 508 similar to forming interlock material 140 in via opening 108, be formed on via sidewalls 518 and 519 similar to forming interlock material 140 on via sidewalls 118 and 119, be formed on interconnect surface 402 similar to forming interlock material 140 on contact surface 102, have thickness 570 similar to thickness 170, and have width 571 similar to width 171, as described in FIG. 3. It is also contemplated that the material of interlock material 540 may be doped, annealed, implanted, etched, radiated, and/or experience other semiconductor processing settings or treatments known in the art for forming semiconductor devices, circuit structures, transistors, and electronic devices, such as described above with respect to interlock material 140.

Interlock material 540 may be formed on, formed over, connected to, form a metal to metal adhesion with, and/or be electrically connected to an area, a portion, and/or a contact area of interconnect surface 402 of interconnect material 460, similar to that of interlock material 140 on contact surface 102, as described in FIG. 3. Thus, interlock material 540 may form an electrical connection or conductive path between a device or material on or connected to the surface of interlock material 540 and interconnect surface interconnect surface 402, similar to that described for interlock material 140 on contact surface 102, for FIG. 3.

Interlock material 540 and interconnect material 460 may have the same, a similar, equal, or relatively close (e.g., such as by being within 2%, 3%, 5%, or 10%) grain structures, mechanical properties (e.g., such as physical material properties) and/or thermal properties (e.g., such as thermal resistance and expansion and retraction coefficients). Also, interlock material 540 may form an electrical connection or conductive path between a device or material on or connected to the surface of interlock material 540 and interconnect surface interconnect surface 402, similar to that described for interlock material 140 on contact surface 102, for FIG. 3. More particularly, interlock material 540 and interconnect material 460 may be formed, such as be being deposited, with a similar or same electrolytic deposition process so that they form a continuous electrolytic material stack, and thus has a similar grain structure, mechanical properties, and thermal properties, similar to that for interlock material 140 and circuit device 106, as described for FIG. 3.

Figure 8:
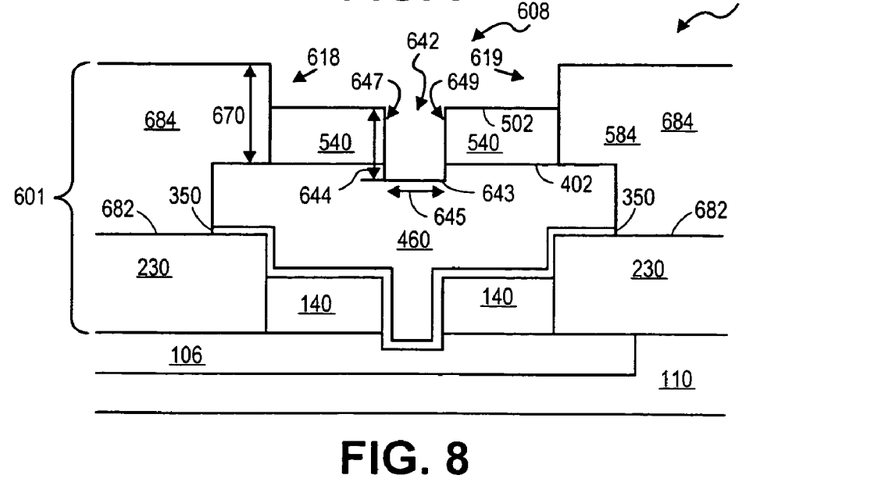
FIG. 8 shows the structure of FIG. 7 after forming another structure similar to the structure of FIG. 7 on the structure shown in FIG. 7.

FIG. 8 shows the structure of FIG. 7 after forming another structure similar to the structure of FIG. 5 on the structure shown in FIG. 7. More particularly, FIG. 8 shows structure 500 of FIG. 7 after photoresist materials 584 and 480 have been removed and replaced with dielectric material 684. For instance, portions or all remaining photoresist materials 584 and 480 as shown in FIG. 7 may be stripped, developed, and/or removed from above, on, or over portions of interconnect surface 402 of interconnect material 460, and portions of surface 682 of dielectric material 230. Moreover, the stripping may also include removal of electroless material 350 from portions of surface 682, as shown in FIG. 8 (e.g., such as including removal of any palladium seed or catalyst material used when forming electroless material 350).

In addition, according to embodiments, after portions or all remaining photoresist materials 584 and 480 have been removed from on, over, or above portions of interconnect surface 402 and portions of surface 682, then, exposed portions of electroless layer 350 may be etched. Specifically, the surface of electroless layer 350 may be etched, such as by "quick etching" with an etch process that includes an $H_2SO_4$ concentrate and/or an $H_2O_2$ concentrate, or other process to remove unwanted portions of electroless layer 350 (e.g., such as by quick etching to remove unwanted portions of electroless layer 350 from portions of the surface of dielectric material 230). It is contemplated that such stripping of photoresist materials or removing of electroless material may include processes described above with respect to removing or patterning a portion of a photoresist layer (e.g., such as dry film stripping remaining photoresist material 115) to form via opening 108, as described above with respect to FIG. 3.

FIG. 8 also shows dielectric material 684 on or over interconnect surface 402 and surface 682. Dielectric material 684 may be formed of a material and by a process such as is described above with respect to forming dielectric material 230 of FIG. 4. It is also considered that dielectric material 684 may include thickness 670 corresponding to depth 270 of FIG. 4. For example, the total thickness of dielectric material 684 may be the sum of thickness 670, depth 475, and thickness 352. In one instance, dielectric material 684 and dielectric material 230 may be the same, or include the same dielectric materials, and/or may be formed by the same, or a similar process.

FIG. 8 also shows via opening 608 in dielectric material 684, having via sidewalls 618 and 619, and to interlock surface 502 and interlock opening 642. According to embodiments, via opening 608 may be formed as described above and have physical dimensions as described above (e.g., such as by having a size, height, width, depth, and/or diameter as described above) with respect to via opening 208 of FIG. 4.

Interlock opening 642 may be formed in interlock surface 502 of interlock material 540, defining interlock sidewalls 647 and 649, to interlock base 643, have interlock depth 644 and interlock width 645. The process to form and physical dimension of interlock opening 642 may correspond to those described above for interlock opening 342 of FIG. 5. For example, interlock opening 642 may be formed by removing a portion of interlock material 540. Therefore, via sidewalls 618 and 619 may correspond to via sidewalls 218 and 219, interlock sidewalls 647 and 649 may correspond to interlock sidewalls 347 and 349, and interlock base 643 may correspond to interlock base 343 of FIGS. 2 and 3.

Next, FIG. 8 identifies structure 601 including dielectric material 684, interlock material 540, interlock opening 542, interconnect material 460, and electroless material 350, as described with respect to FIGS. 1–6. It is noted that a structure similar to structure 601 may be subsequently formed on or over structure 600, such as is described above with respect to forming structure 601 on dielectric material 230, interlock material, and interlock opening 342.

Figure 9:
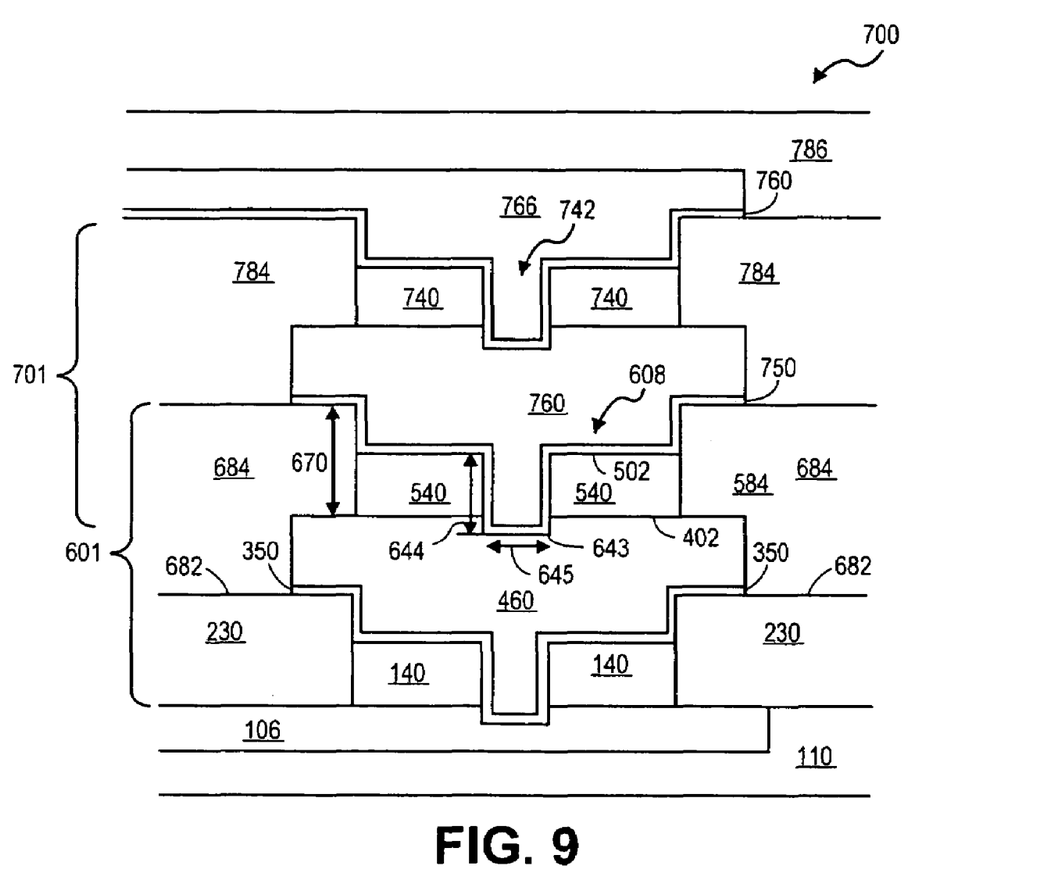
FIG. 9 shows the structure of FIG. 8 after forming a final interconnect material and dielectric solder resist over the structure of FIG. 8.

For example, FIG. 9 shows the structure of FIG. 8 after forming a final interconnect material and dielectric solder resist over the structure of FIG. 8. FIG. 9 shows the structure 600 after forming another structure similar to structure 601 of FIG. 8 on structure 600. For example, FIG. 9 shows structure 700 including structure 701 formed over or on structure 601, such as where structure 701 is a structure similar to structure 601 as described above with respect to FIGS. 1–6. Thus, FIG. 9 shows dielectric material 784, interlock material 740, interlock opening 742, interconnect material 766, electroless material 750, and electroless material 760 formed of a material, by a process, and have physical dimensions such as that of dielectric material 684, interlock material 540, interlock opening 542, interconnect material 460, and electroless material 350, as described with respect to FIGS. 1–6.

Thus, it can be appreciated that one or more additional structures, such as structure 701, may be formed on or above structure 601. As such, a stack or column of interconnect material can be formed vertically above structure 601 to form 3, 4, 5, 6, 7, or more structures, such as structure 701 on structure 601 and/or circuit device 106.

According to embodiments, structure 701, or a structure similar to structure 701 formed above structure 701, may have a final interconnect material structure formed thereon, such as to form a final interconnection or trace, contact, or circuit device on structure 701. For instance, FIG. 9 additionally shows the structure 701 after forming a final interconnect material and dielectric solder resist over structure 701. FIG. 9 shows final interconnect material 766 and electroless material 760 formed on dielectric material 784, on interlock material 740, and in interlock opening 742. According to embodiments, final interconnect material 766 and electroless material 760 may be formed of a material, by a process, and have physical dimensions such as that of dielectric material 684, interlock material 540, interlock opening 542, interconnect material 460, and electroless material 350, as described with respect to FIGS. 1–6. It is also noted that final interconnect material 766 and electroless material 760 may have physical dimensions such as those for circuit device 106, structure 100, or an interconnect or trace, as described with respect to FIGS. 1.

FIG. 9 also shows dielectric solder resist 786 formed over or on final interconnect material 766 and dielectric material 784. Dielectric solder resist 786 may be formed of a material, by a process, doped, planarized, annealed, and/or radiated, as described above with respect to forming dielectric material 230 and/or dielectric material 110.

For instance, it can be appreciated that physical dimensions, materials, and formation processes of structures 100, 200, 300, 400, 500, 600, and/or 700 may be selected, or performed, such as is described herein, so that those structures form "stacks" or "columns" of conductive contacts and/or interconnections that can "survive" (e.g., such as by "surviving" or avoiding being damaged or delaminated between subsequent layers of conductive contact and/or interconnection material sufficiently to fail at performing their required electrical function) during the life period of a substrate, circuit device, board or PCB including such structures. Hence, such structures may be formed to survive thermal variations and vertical tensile strain expected during manufacture, packaging, attachment, use, repair, maintenance, upgrade, etc . . . of such structures, and devices and other structures attached thereto. For instance, such structures may be formed to survive those processes for a period of up to 7 to 10 years of use for such structures, by considering the materials, formation processes, sizes, and other factors described above, and the descriptions herein for FIGS. 1–7.

In the foregoing specification, specific embodiments are described. However, various modifications and changes may be made thereto without departing from the broader spirit and scope of embodiments as set forth in the claims. For instance, mention above of either electrolytic or electroless material or deposition may be expanded to include both electrolytic and electroless material or deposition (e.g., such as electrodeposition) The specification and drawings are, accordingly, to be regarded in an illustrative rather than a restrictive sense.

What is claimed is:

1. A method comprising:
    forming an interlock opening in an interlock surface of an interlock material formed on a contact surface of a circuit device having a first electrically conductive material, the interlock material having a second electrically conductive material,
    wherein the interlock opening has a plurality of interlock sidewalls extending through the interlock material, through the contact surface, and to an interlock base surface of the first electrically conductive material.

2. The method of claim 1, wherein the circuit device is on a first dielectric material and, prior to forming the interlock opening, the method further comprising:
forming the interlock material in a photoresist opening in a photoresist material overlying the circuit device and the first dielectric material, wherein the photoresist opening has a plurality of photoresist sidewalls and extends to the contact surface.

3. The method of claim 2, wherein forming the interlock material includes electrolytic plating metal in the photoresist opening, on the photoresist sidewalls, and to the contact surface.

4. The method of claim 1, wherein forming the interlock opening further comprises drilling the interlock opening through the interlock material and contact surface, and to the interlock base with a laser.

5. The method of claim 1, further comprising electroless plating an electroless material on a second dielectric material over the circuit device, in a via opening in the second dielectric material having a plurality of via sidewalls extending to the interlock surface, on the via sidewalls, on the interlock surface, in the interlock opening, on the interlock sidewalls, and on the interlock base.

6. The method of claim 5, wherein electroless plating includes electroless plating metal on the second dielectric material, in the via opening, on the via sidewalls, on the interlock surface, in the interlock opening, on the interlock sidewalls, and on the interlock base.

7. The method of claim 5, further comprising:
electrolytic plating an interconnect material in the via opening, in the interlock opening, on the electroless material and to the interlock base.

8. The method of claim 5, further comprising forming an interconnect material in a trench opening in a photoresist material overlying the second dielectric, the trench opening having a plurality of photoresist sidewalls extending to a trench base on a surface of the second dielectric around the via opening;
wherein the interconnect material is formed on the trench sidewalls, on the trench base, in the via opening, in the interlock opening, on the electroless material, and to the interlock base.

9. The method of claim 8, wherein forming the interconnect material includes electrolytic plating one of a metal, a gold, a silver, a copper, an aluminum, and a nickel in the trench opening, on the trench sidewalls, on the trench base, in the via opening, in the interlock opening, on the electroless material, and to the interlock base.

10. The method of claim 8, wherein the interlock material is a first interlock material, the method further comprising:
forming a second interlock material in a second photoresist opening in a second photoresist material over the first photoresist material and over the interconnect material, wherein the second photoresist opening has a plurality of second photoresist sidewalls and extends to an interconnect surface of the interconnect material.

11. The method of claim 10, wherein forming the second interlock material includes electrolytic plating metal in the photoresist opening, on the second photoresist sidewalls, and to the interconnect surface.

12. The method of claim 10, wherein the via opening is a first via opening, the via walls are first via walls, and the interlock surface is a first interlock surface, the method further comprising:
forming a third dielectric material over the interconnect material;
forming a second via opening in the third dielectric material, the second via opening having a plurality of second via sidewalls extending to a second interlock surface of the second interlock material.

13. The method of claim 12, wherein the interlock opening is a first interlock opening, the interlock surface is a first interlock surface, and the interlock base is a first interlock base, the method further comprising:
drilling a second interlock opening through the second interlock material and the interconnect surface, and to a second interlock base with a laser.

14. The method of claim 13, wherein the electroless material is a first electroless material, the method further comprising:
electroless plating a second electroless material on the second interlock material, in the second via opening, on the second via sidewalls, on the second interlock surface, on the second interlock sidewalls, and on the second interlock base.

15. The method of claim 14, wherein the interconnect material is a first interconnect material, the method further comprising:
electrolytic plating a second interconnect material in the second via opening, on the second electroless material and to the second interlock base.

16. The method of claim 15, wherein the interconnect material is a first interconnect material, the method further comprising:
further comprising forming a second interconnect material in the second via opening, on the second via sidewalls, on the second interlock surface, on the second interlock sidewalls, and on the second interlock base.

17. The method of claim 16, wherein forming the second interconnect material includes electrolytic plating metal the second via opening, on the second via sidewalls, on the second interlock surface, on the second interlock sidewalls, and on the second interlock base.

18. The method of claim 10, further comprising one of heating the first and second interlock materials, thermally treating the first and second interlock materials, annealing the first and second interlock materials, and exposing the first and second interlock materials to a vertical tensile strain.

* * * * *